(12) United States Patent
Kachi

(10) Patent No.: US 11,522,058 B2
(45) Date of Patent: Dec. 6, 2022

(54) SEMICONDUCTOR DEVICE WITH FIELD PLATE ELECTRODE

(71) Applicants: Kabushiki Kaisha Toshiba, Tokyo (JP); Toshiba Electronic Devices & Storage Corporation, Tokyo (JP)

(72) Inventor: Tsuyoshi Kachi, Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/177,749

(22) Filed: Feb. 17, 2021

(65) Prior Publication Data

US 2022/0085177 A1 Mar. 17, 2022

(30) Foreign Application Priority Data

Sep. 11, 2020 (JP) .............................. JP2020-153263

(51) Int. Cl.
*H01L 29/40* (2006.01)
*H01L 29/78* (2006.01)
*H01L 29/06* (2006.01)

(52) U.S. Cl.
CPC ........ *H01L 29/407* (2013.01); *H01L 29/0696* (2013.01); *H01L 29/404* (2013.01); *H01L 29/7805* (2013.01); *H01L 29/7813* (2013.01)

(58) Field of Classification Search
CPC . H01L 29/407; H01L 29/0696; H01L 29/404; H01L 29/7805; H01L 29/7813

(Continued)

(56) References Cited

U.S. PATENT DOCUMENTS 9,064,839 B2 6/2015 Matsuura et al.
2003/0001203 A1* 1/2003 Ono ..................... H01L 29/0878
257/329

(Continued)

FOREIGN PATENT DOCUMENTS

DE 102007014038 A1 * 9/2008 ......... H01L 29/0878
JP 2012-256628 A 12/2012

(Continued)

*Primary Examiner* — Mohammad M Hoque
(74) *Attorney, Agent, or Firm* — Allen & Overy LLP

(57) ABSTRACT

A semiconductor device includes a first electrode, a first semiconductor layer connected to the first electrode, a second semiconductor layer on the first semiconductor layer, a third semiconductor layer on the second semiconductor layer, a fourth semiconductor layer on the third semiconductor layer, a second electrode connected to the third and fourth semiconductor layers, a gate electrode extending from the fourth toward the second semiconductor layer next to the third semiconductor layer, a field plate electrode extending in a direction from the fourth toward the second semiconductor layer next to the second semiconductor layer, and a first insulating film between the field plate electrode and the second semiconductor layer and having a lower end further from the field plate electrode than the first semiconductor layer; the first, second, and fourth semiconductor layers are of a first conductivity type; and the third semiconductor layer is of a second conductivity type.

9 Claims, 11 Drawing Sheets

(58) Field of Classification Search
USPC .......................................................... 257/330
See application file for complete search history.

(56) References Cited

U.S. PATENT DOCUMENTS

2014/0015039 A1* 1/2014 Hossain .................. H01L 29/36
438/270
2017/0110572 A1* 4/2017 Zundel .................. H01L 29/167
2018/0212027 A1* 7/2018 Cai .................... H01L 29/66734

FOREIGN PATENT DOCUMENTS

| JP | 2015-149346 A | 8/2015 | | |
| JP | 2019-140152 A | 8/2019 | | |
| JP | 2019145701 A | * 8/2019 | ........... | H01L 21/266 |
| WO | WO-2017168734 A1 | * 10/2017 | ........... | H01L 29/407 |

* cited by examiner

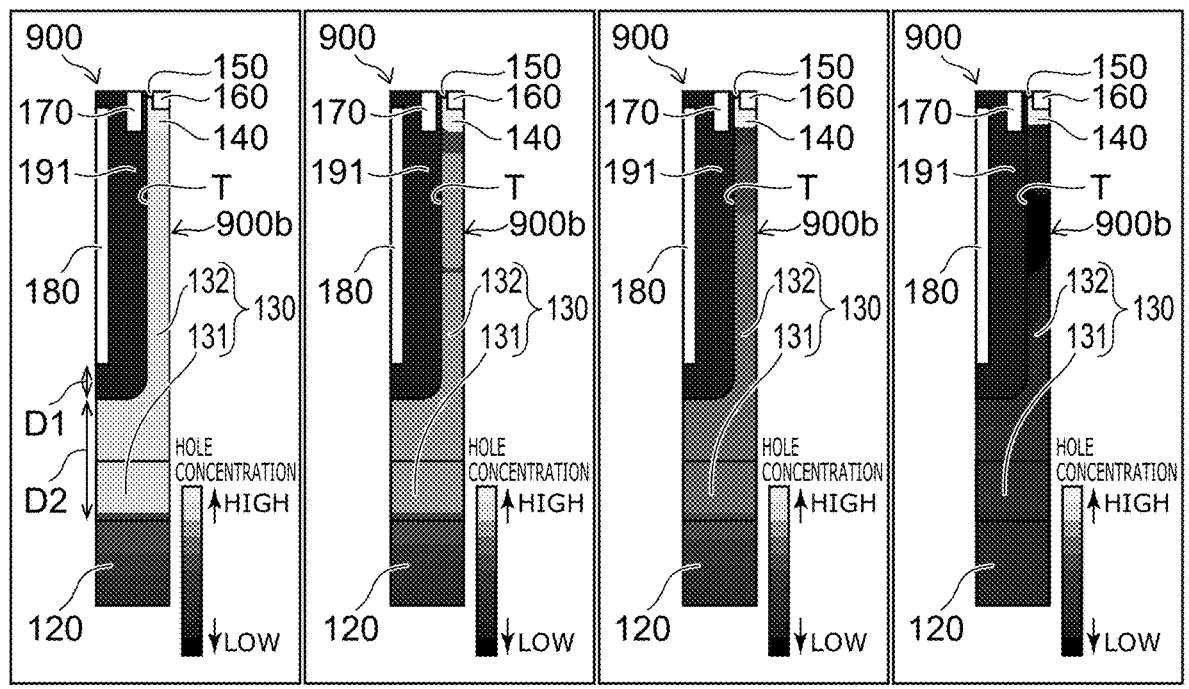
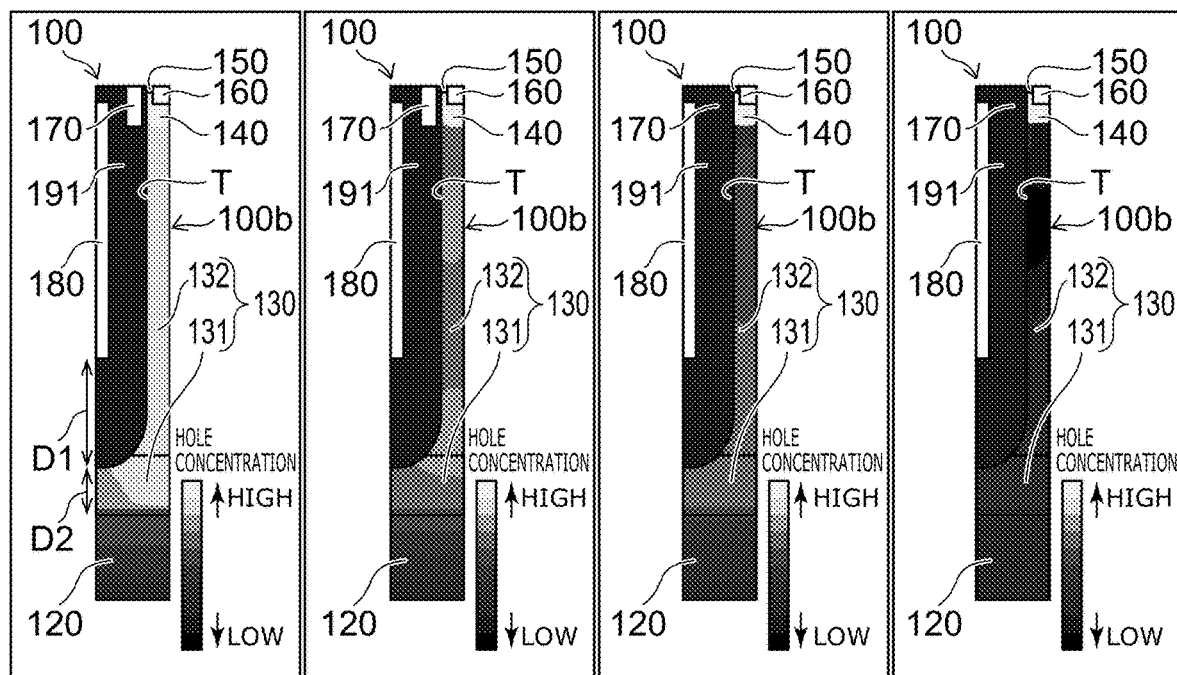
FIG. 10A FIG. 10B FIG. 10C FIG. 10D FIG. 10E FIG. 10F FIG. 10G FIG. 10H

SEMICONDUCTOR DEVICE WITH FIELD PLATE ELECTRODE

CROSS-REFERENCE TO RELATED APPLICATIONS

This application is based upon and claims the benefit of priority from Japanese Patent Application No. 2020-153263, filed on Sep. 11, 2020; the entire contents of which are incorporated herein by reference.

FIELD

Embodiments relate to a semiconductor device,

BACKGROUND

A semiconductor device such as a MOSFET (Metal-Oxide-Semiconductor Field-Effect Transistor) or the like includes a body diode,

BRIEF DESCRIPTION OF THE DRAWINGS

FIGS. 10A to 10D are maps showing simulation results of the hole concentration distribution in the semiconductor device according to the reference example;

FIGS. 10E to 10H are maps showing simulation results of the hole concentration distribution in the semiconductor device according to the first embodiment.

DETAILED DESCRIPTION

A semiconductor device according to an embodiment includes a first electrode, a first semiconductor layer connected to the first electrode, a second semiconductor layer provided on the first semiconductor layer, a third semiconductor layer provided on the second semiconductor layer, a fourth semiconductor layer provided on the third semiconductor layer, a second electrode connected to the third and fourth semiconductor layers, a gate electrode that extends from the fourth semiconductor layer toward the second semiconductor layer and is next to the third semiconductor layer, a field plate electrode that extends in a direction from the fourth semiconductor layer toward the second semiconductor layer, extends lower than the gate electrode, and is next to the second semiconductor layer, and a first insulating film that is provided between the gate electrode and the third semiconductor layer, between the field plate electrode and the second semiconductor layer, and between the gate electrode and the field plate electrode, wherein the first, second, and fourth semiconductor layers are of the first conductivity type, the third semiconductor layer is of a second conductivity type, an impurity concentration of the second semiconductor layer is less than an impurity concentration of the first semiconductor layer, and a first distance from a lower end of the first insulating film to a lower end of the field plate electrode is greater than a second distance from the lower end of the first insulating film to the first semiconductor layer.

First Embodiment

First, a first embodiment will be described.

Figure 1:
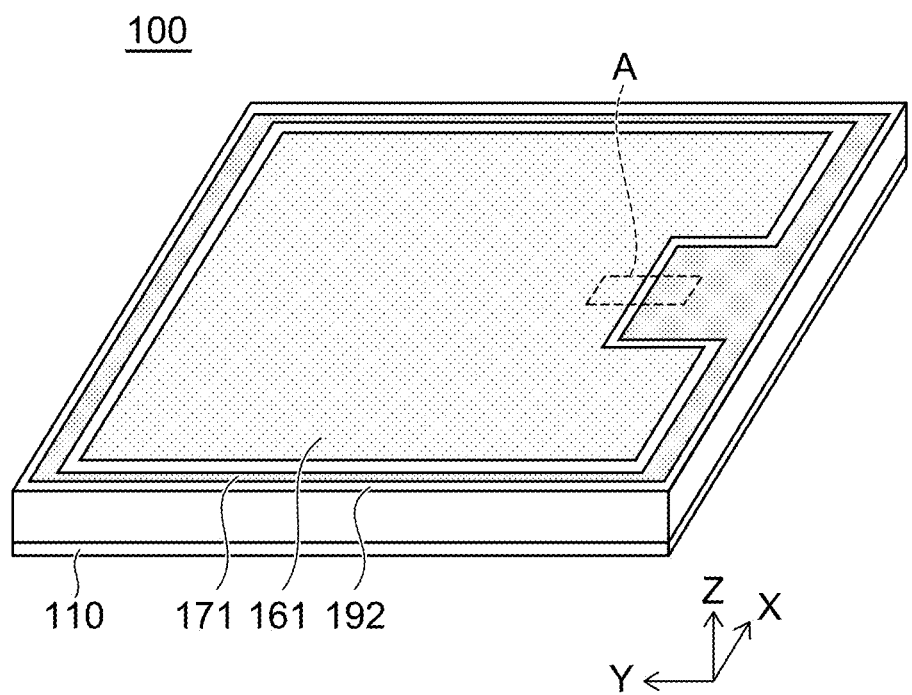
FIG. 1 is a perspective view showing a semiconductor device according to a first embodiment.
Figure 2:
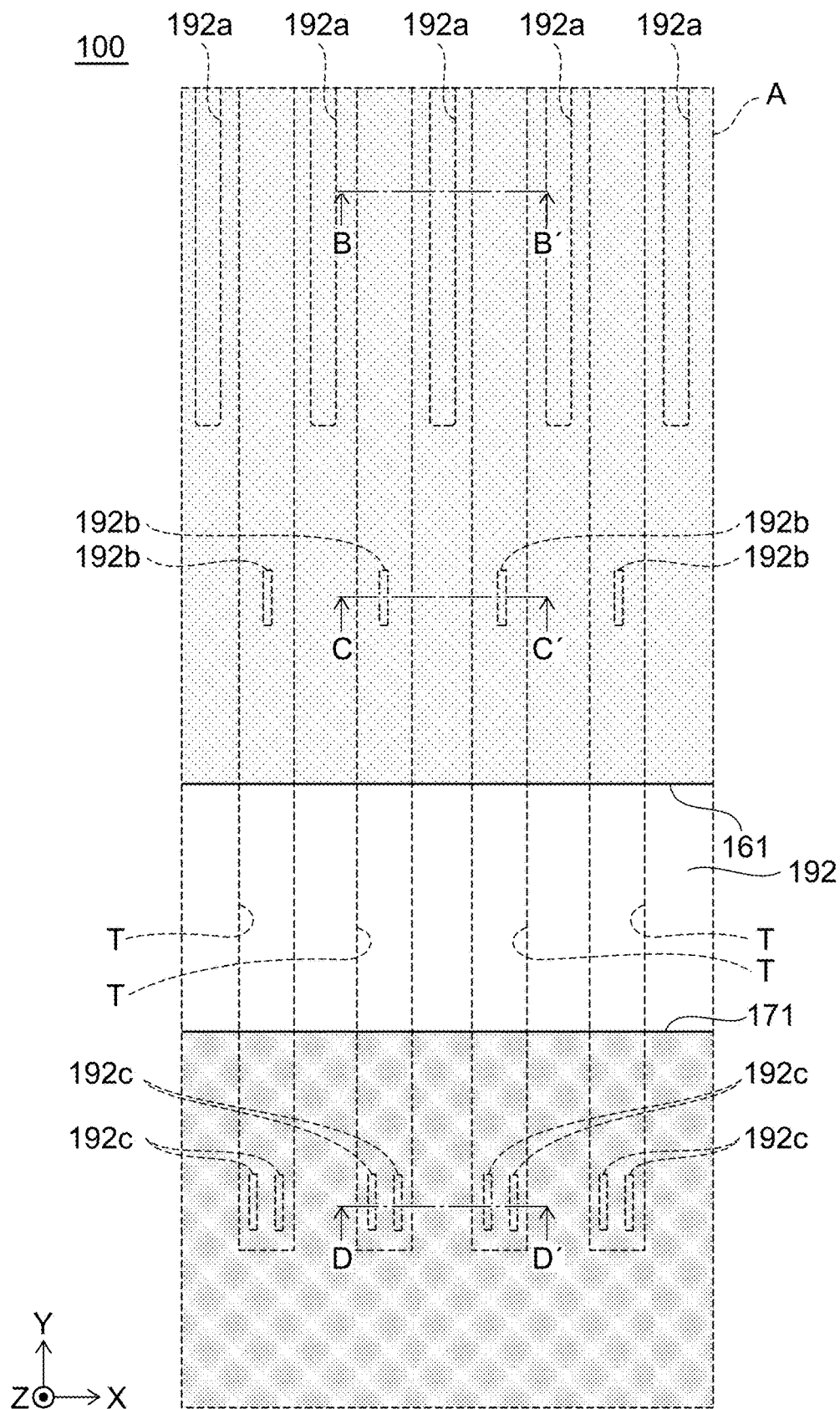
FIG. 2 is an enlarged top view showing the region surrounded with broken line A of FIG. 1.

FIG. 1 is a perspective view showing a semiconductor device according to the embodiment, FIG. 2 is an enlarged top view showing the region surrounded with broken line A of FIG. 1.

Figure 3:
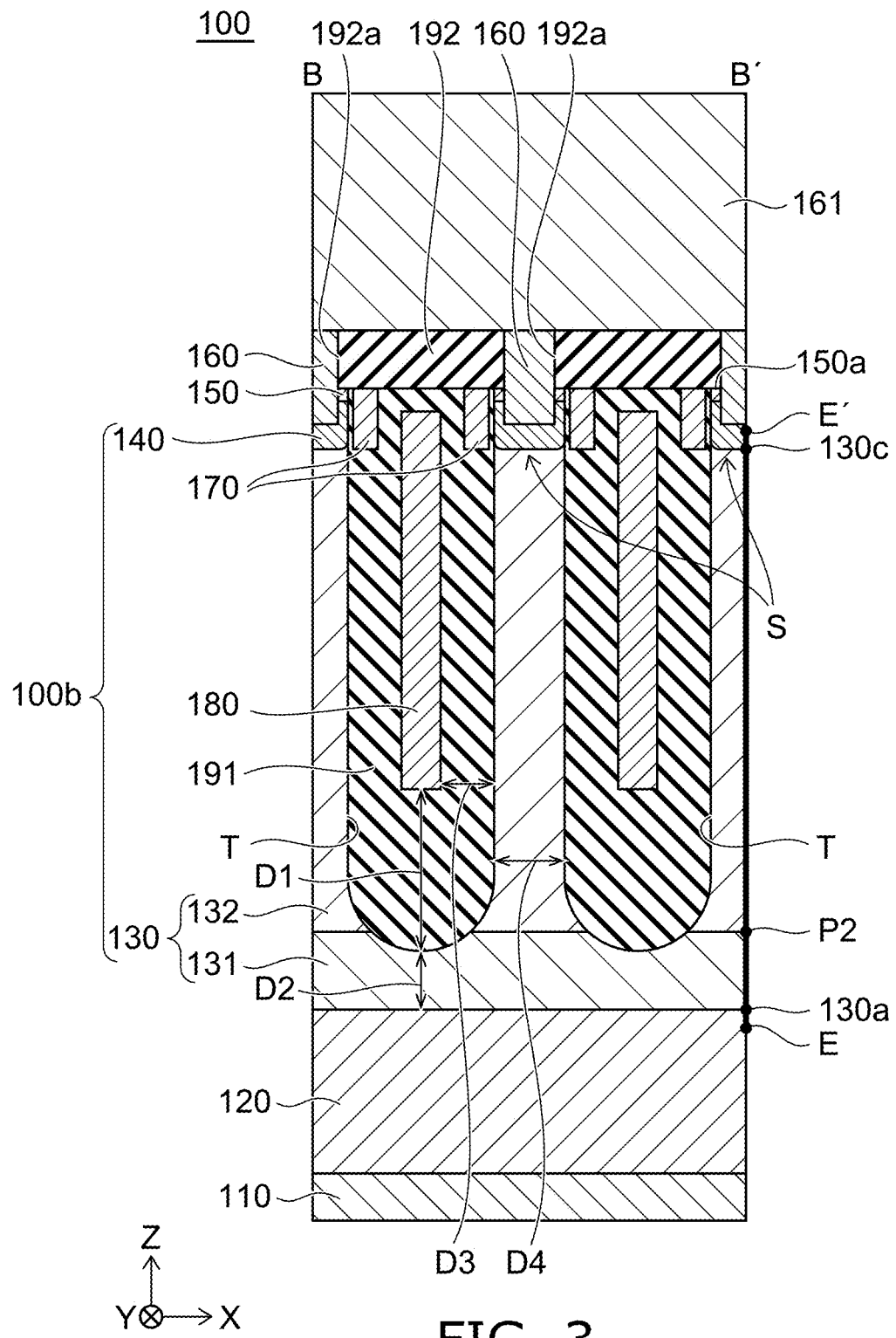
FIG. 3 is a cross-sectional view along line B-B' of FIG. 2.

FIG. 3 is a cross-sectional view along line B-B' of FIG. 2.

Figure 4:
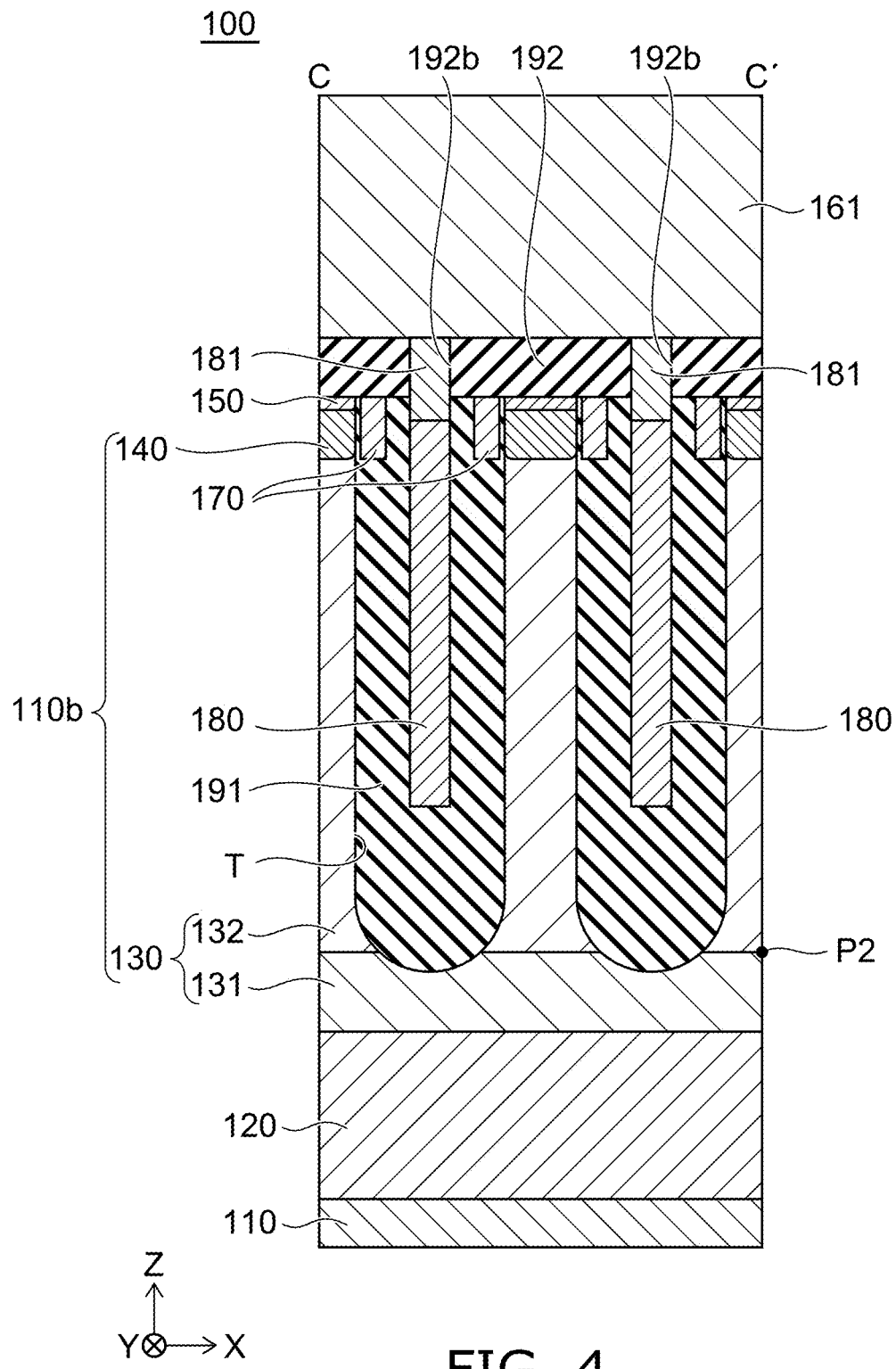
FIG. 4 is a cross-sectional view along line C-C' of FIG. 2.

FIG. 4 is a cross-sectional view along line C-C' of FIG. 2.

Figure 5:
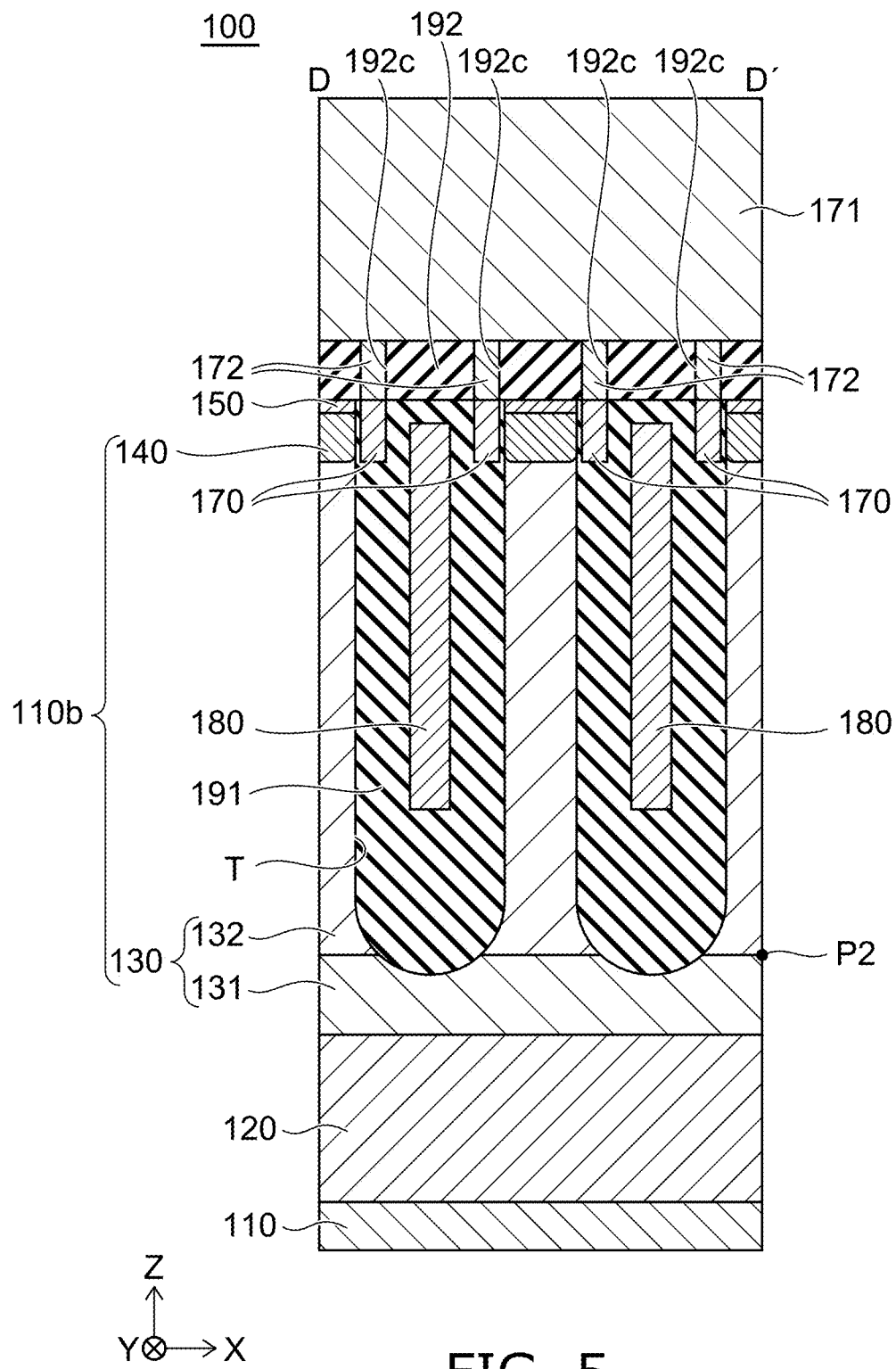
FIG. 5 is a cross-sectional view along line D-D' of FIG. 2.

FIG. 5 is a cross-sectional view along line D-D' of FIG. 2.

The semiconductor device 100 according to the embodiment is a MOSFET. Generally speaking, as shown in FIG. 3, the semiconductor device 100 includes a drain electrode (a first electrode) 110, an $n^+$-drain layer (a first semiconductor layer) 120, an n-semiconductor layer (a second semiconductor layer) 130, a p-base diffusion layer (a third semiconductor layer) 140, an $n^+$-source diffusion layer (a fourth semiconductor layer) 150, a source electrode (a second electrode) 160, a gate electrode 170, and a field plate electrode 180.

The components of the semiconductor device 100 will now be elaborated. Hereinbelow, an XYZ orthogonal coordinate system is used for easier understanding of the description. A direction from the drain electrode 110 toward the source electrode 160 is taken as a "Z-direction". One direction orthogonal to the Z-direction is taken as an "X-direction". One direction orthogonal to the Z-direction and the X-direction is taken as a "Y-direction". Also, the Z-direction is called the "upward direction", and the reverse direction of the Z-direction is called the "downward direction".

Hereinbelow, the notations of $n^+$ and n indicate relative levels of the impurity concentrations of the conductivity types. Specifically, a notation marked with "+" indicates that the impurity concentration is relatively greater than that of a notation not marked with "+". Here, when both an impurity that forms donors and an impurity that forms acceptors are included in each region, the "impurity concentration" refers to the net impurity concentration after the impurities have canceled each other.

As shown in FIG. 1, the drain electrode 110 is substantially flat-plate shaped. As shown in FIG. 3, the n$^+$-drain layer 120 is provided on the drain electrode 110.

The n$^+$-drain layer 120 is connected to the drain electrode 110. For example, the n$^+$-drain layer 120 can be formed by adding, to a silicon substrate, an impurity that forms donors. The n-semiconductor layer 130 is provided on the n$^+$-drain layer 120.

The n-semiconductor layer 130 includes an n-buffer region (a first region) 131, and an n-drift region (a second region) 132 provided on the n-buffer region 131. The impurity concentration of the n-buffer region 131 is less than the impurity concentration of the n$^+$-drain layer 120. The impurity concentration of the n-drift region 132 is less than the impurity concentration of the n-buffer region 131.

The p-base diffusion layer 140 is provided on the n-semiconductor layer 130. The n$^+$-source diffusion layer 150 is provided on the p-base diffusion layer 140.

Multiple trenches T are provided in the n-semiconductor layer 130, the p-base diffusion layer 140, and the n$^+$-source diffusion layer 150. As shown in FIG. 2, each trench T extends in the Y-direction. The multiple trenches T are arranged in the X-direction.

As shown in FIG. 3, each trench T extends downward from an upper surface 150a of the n$^+$-source diffusion layer 150 and reaches the n-buffer region 131 of the n-semiconductor layer 130. However, the trench may not reach the n-buffer region. The lower end of each trench T is separated from the n$^+$-drain layer 120. However, the trench may reach the n$^+$-drain layer. The lower portion of each trench T is rounded. However, the lower portion of each trench T may not be rounded.

The p-base diffusion layer 140 and the n$^+$-source diffusion layer 150 are divided into multiple regions S by the multiple trenches T. The multiple regions S are arranged in the X-direction.

The gate electrode 170, the field plate electrode 180, and an insulating film 191 are provided in each trench T.

In the embodiment, two gate electrodes 170 are provided in one trench T. The two gate electrodes 170 are located at the upper end of each trench T and are separated from each other in the X-direction. Each gate electrode 170 is next to the p-base diffusion layer 140 and the n$^+$-source diffusion layer 150 in the X-direction. Each gate electrode 170 extends in the Y-direction.

The upper end portion of the field plate electrode 180 is located between the two gate electrodes 170 in each trench T. The lower end of the field plate electrode 180 is positioned lower than the lower end of the gate electrode 170. The field plate electrode 180 is next to the n-drift region 132 of the n-semiconductor layer 130 in the X-direction. Each field plate electrode 180 extends in the Y-direction.

Thus, the field plate electrode 180 is provided in the semiconductor device 100. Therefore, the concentration of the electric field in the n-semiconductor layer 130 can be suppressed. As a result, the breakdown voltage of the semiconductor device 100 can be increased.

The insulating film 191 is provided in each trench T between the gate electrode 170 and the p-base diffusion layer 140, between the gate electrode 170 and the n$^+$-source diffusion layer 150, between the field plate electrode 180 and the n-semiconductor layer 130, and between the gate electrode 170 and the field plate electrode 180. For example, the insulating film 191 is made of an insulating material such as silicon oxide, silicon nitride, etc.

A first distance D1 between the lower end of the field plate electrode 180 and the lower end of the insulating film 191 is greater than a second distance D2 between the insulating film 191 and the n$^+$-drain layer 120. The first distance D1 is greater than a third distance D3 between the side surface of the field plate electrode 180 and the side surface of the insulating film 191. It is favorable for the first distance D1 to be not less than 2 times the third distance D3. Also, the first distance D1 is greater than a fourth distance D4 between two adjacent trenches T (or insulating films 191).

As described above, the lower end of each trench T (or each insulating film 191) reaches the n-buffer region 131 of the n-semiconductor layer 130. Therefore, the lower end of the insulating film 191 is positioned lower than the upper end of the n-buffer region 131.

An insulating film 192 is provided on the n$^+$-source diffusion layer 150 and the insulating film 191. For example, the insulating film 192 is made of a material similar to the insulating film 191.

As shown in FIGS. 1 and 2, a source electrode pad 161 and a gate electrode pad 171 are provided on the insulating film 192. The gate electrode pad 171 surrounds the source electrode pad 161 when viewed in top-view. In FIGS. 1 and 2, the regions in which the source electrode pad 161 and the gate electrode pad 171 are provided are shown using mutually-different dot patterns for easier understanding of the description.

As shown in FIG. 3, multiple trenches 192a that extend downward from the upper surface of the insulating film 192 are provided in the insulating film 192, the n$^+$-source diffusion layer 150, and the p-base diffusion layer 140. Each trench 192a (or each insulating film 192) is located directly under the source electrode pad 161. The multiple trenches 192a (or the multiple insulating films 192) are arranged in the X-direction. As shown in FIG. 2, each trench 192a (or each insulating film 192) extends in the Y-direction.

As shown in FIG. 3, the source electrode 160 is provided in each trench 192a. The source electrode 160 is connected to the phase diffusion layer 140 and the n$^+$-source diffusion layer 150.

As shown in FIG. 4, multiple openings 192b that individually expose the multiple field plate electrodes 180 are provided in the insulating films 191 and 192. Each opening 192b is positioned directly above the field plate electrode 180 and directly under the source electrode pad 161. The multiple openings 192b are arranged in the X-direction. As shown in FIG. 2, each opening 192b is positioned further outward than the trench 192a in the Y-direction.

As shown in FIG. 4, a conductive connection member 181 is provided in each opening 192b. The conductive connection member 181 is connected to the field plate electrode 180 and the source electrode pad 161.

As shown in FIG. 5, multiple openings 192c that individually expose the multiple gate electrodes 170 are provided in the insulating films 191 and 192. Each opening 192c is positioned directly above the gate electrode 170 and directly under the gate electrode pad 171.

A conductive connection member 172 is provided in each opening 192c. The conductive connection member 172 is connected to the gate electrode 170 and the gate electrode pad 171.

In the semiconductor device 100, the n-semiconductor layer 130 and the p-base diffusion layer 140 are included in a body diode 100b.

The impurity concentration distribution in the vertical direction of the n-semiconductor layer 130 will now be described.

Figure 6A:
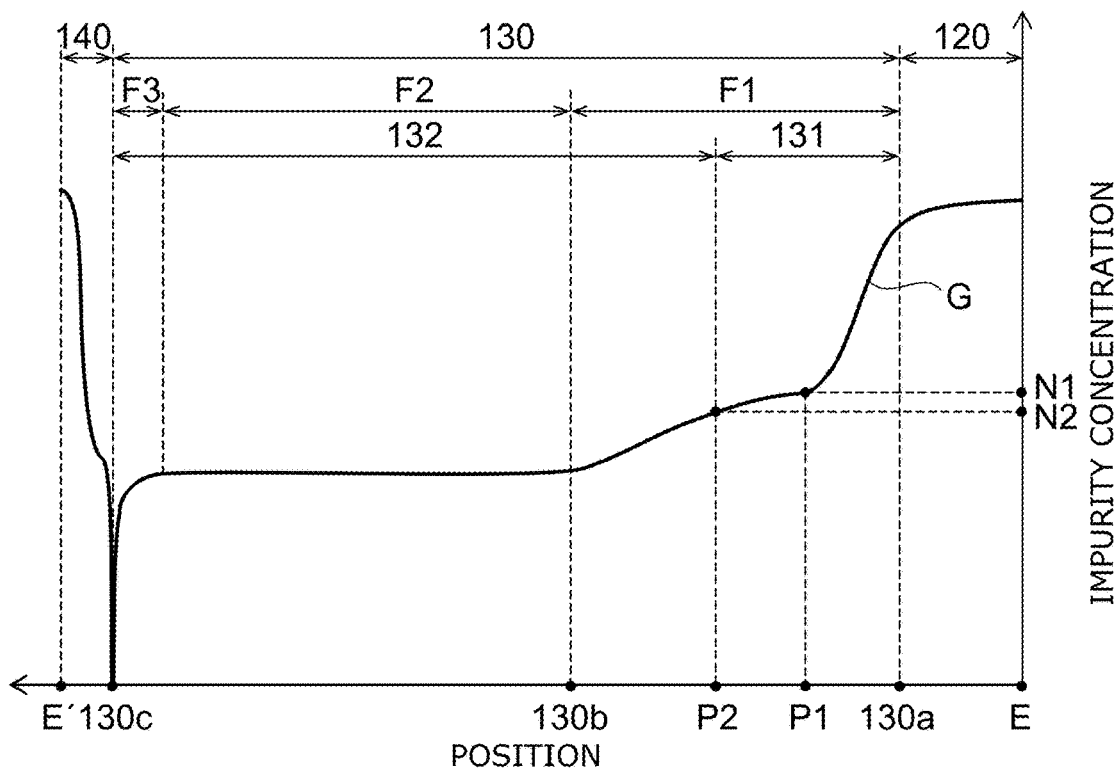
FIG. 6A is a graph showing an impurity concentration distribution along line E-E' of FIG. 3, in which the horizontal axis is the position in the vertical direction, and the vertical axis is the impurity concentration having a logarithmic scale.
Figure 6B:
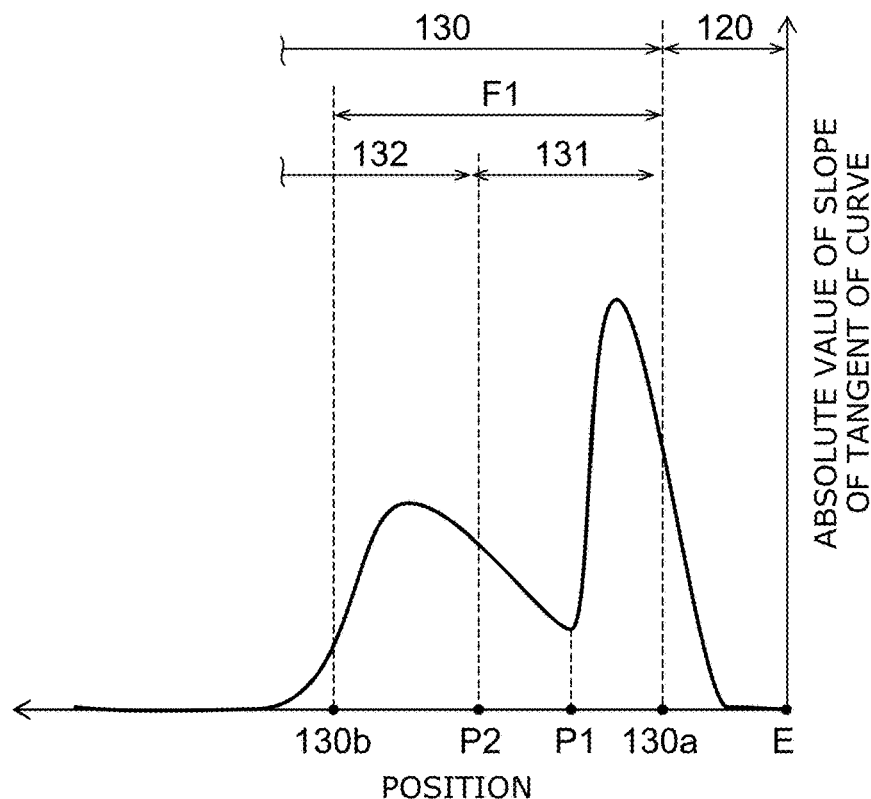
FIG. 6B is a graph showing the change of the absolute value of the slope of the tangent of the curve shown in FIG. 6A, in which the horizontal axis is the position in the vertical direction, and the vertical axis is the absolute value of the tangent of the curve shown in FIG. 6A.

FIG. 6A is a graph showing the impurity concentration distribution along line E-E' of FIG. 3, in which the horizontal axis is the position in the vertical direction, and the vertical axis is the impurity concentration having a logarithmic scale; and FIG. 6B is a graph showing the change of the absolute value of the slope of the tangent of the curve shown in FIG. 6A, in which the horizontal axis is the position in the vertical direction, and the vertical axis is the absolute value of the slope of the tangent of the curve shown in FIG. 6A.

The impurity concentration of the $n^+$-drain layer 120 is substantially constant. The impurity concentration of the n-semiconductor layer 130 is less than the impurity concentration of the $n^+$-drain layer 120.

In the embodiment, the n-semiconductor layer 130 includes a region F1 in which the impurity concentration gradually decreases along the upward direction from a lower end 130a of the n-semiconductor layer 130, a region F2 that is positioned on the region F1 and has a substantially constant impurity concentration at each position in the vertical direction, and a region F3 that is positioned on the region F2 and has an impurity concentration that gradually decreases along the upward direction.

Along the upward direction in the region F1, first, the impurity concentration abruptly decreases; then, the decrease of the impurity concentration becomes gradual; then, the decrease rate of the impurity concentration increases again. Accordingly, the absolute value of the slope of the tangent of a curve G of the impurity concentration profile in the vertical direction of the region F1 has a minimum in the region F1 at a first position P1 between an upper end 130b and the lower end 130a. An impurity concentration N2 at a second position P2 positioned above the first position P1 is one-half of an impurity concentration N1 at the first position P1. In other words, N2=N½.

The region of the n-semiconductor layer 130 from the lower end 130a to the second position P2 corresponds to the n-buffer region 131. The region of the n-semiconductor layer 130 from the second position P2 to an upper end 130c of the n-semiconductor layer 130 corresponds to the n-drift region 132.

Accordingly, the impurity concentration of the n-buffer region 131 is less than the impurity concentration of the $n^+$-drain layer 120, and the impurity concentration of the n-drift region 132 is less than the impurity concentration of the n-buffer region 131.

For example, the n-semiconductor layer 130 is formed by epitaxially growing an n-type semiconductor layer on the $n^+$-drain layer 120. At this time, the n-semiconductor layer 130 can be formed with an impurity concentration such as that shown in FIG. 6A by adjusting the concentration of the impurity gas. However, the concentration distribution in the vertical direction of the n-semiconductor layer 130 is not limited to the concentration distribution shown in FIG. 6A.

Figure 7:
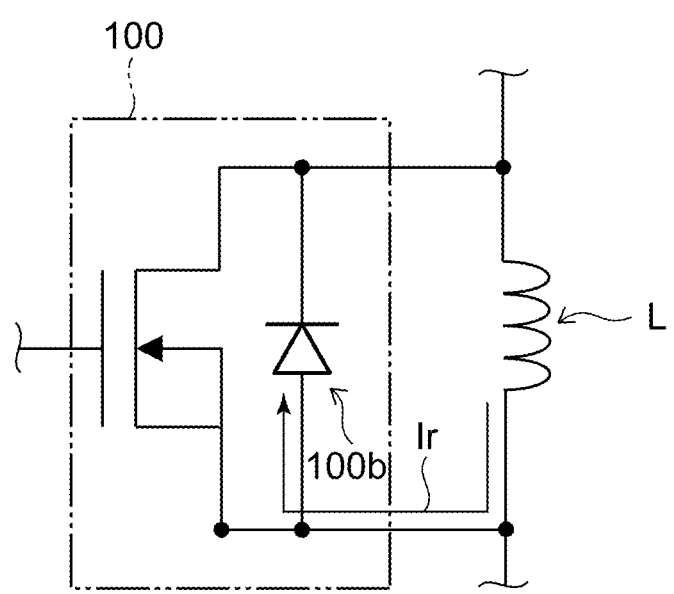
FIG. 7 is a circuit diagram showing a utilization example of the semiconductor device according to the first embodiment.

FIG. 7 is a circuit diagram showing a utilization example of the semiconductor device according to the embodiment.

For example, the semiconductor device 100 is connected to an inductive load L and is used to control the current flowing in the inductive load L. In such a case, the body diode 100b of the semiconductor device 100 may be used as a freewheeling diode. Specifically, there are cases where a flyback voltage is generated by the self-induction action of the inductive load L when switching a switch of the inductive load L. When the body diode 100b is used as a freewheeling diode, the application of the flyback voltage to the connection destination of the inductive load L can be suppressed because a current Ir that is generated by the self-induction action flows in the body diode 100b.

When the body diode 100b is used as a freewheeling diode, it is favorable for the switching time and the switching loss of the body diode 100b to be small. The switching time and the switching loss of the body diode 100b can be reduced by improving the reverse recovery characteristic of the body diode 100b.

A current flows in the forward direction when the body diode 100b is biased in the forward direction. Thereby, minority carriers (holes) are injected from the p-base diffusion layer 140 into the n-semiconductor layer 130. Therefore, when the body diode 100b is switched from this state to a state of being biased in the reverse direction, a current flows in the reverse direction for a constant amount of time until the holes that were injected are ejected from the n-semiconductor layer 130. The "reverse recovery characteristic" means the recovery characteristic of the body diode when the bias is thus changed from the forward direction to the reverse direction. Here, "biased in the forward direction" means that a voltage is applied to the drain electrode 110 and the source electrode 160 so that the potential of the source electrode 160 is greater than the potential of the drain electrode 110. "Biased in the reverse direction" means that a voltage is applied to the drain electrode 110 and the source electrode 160 so that the potential of the drain electrode 110 is greater than the potential of the source electrode 160.

Figure 8:
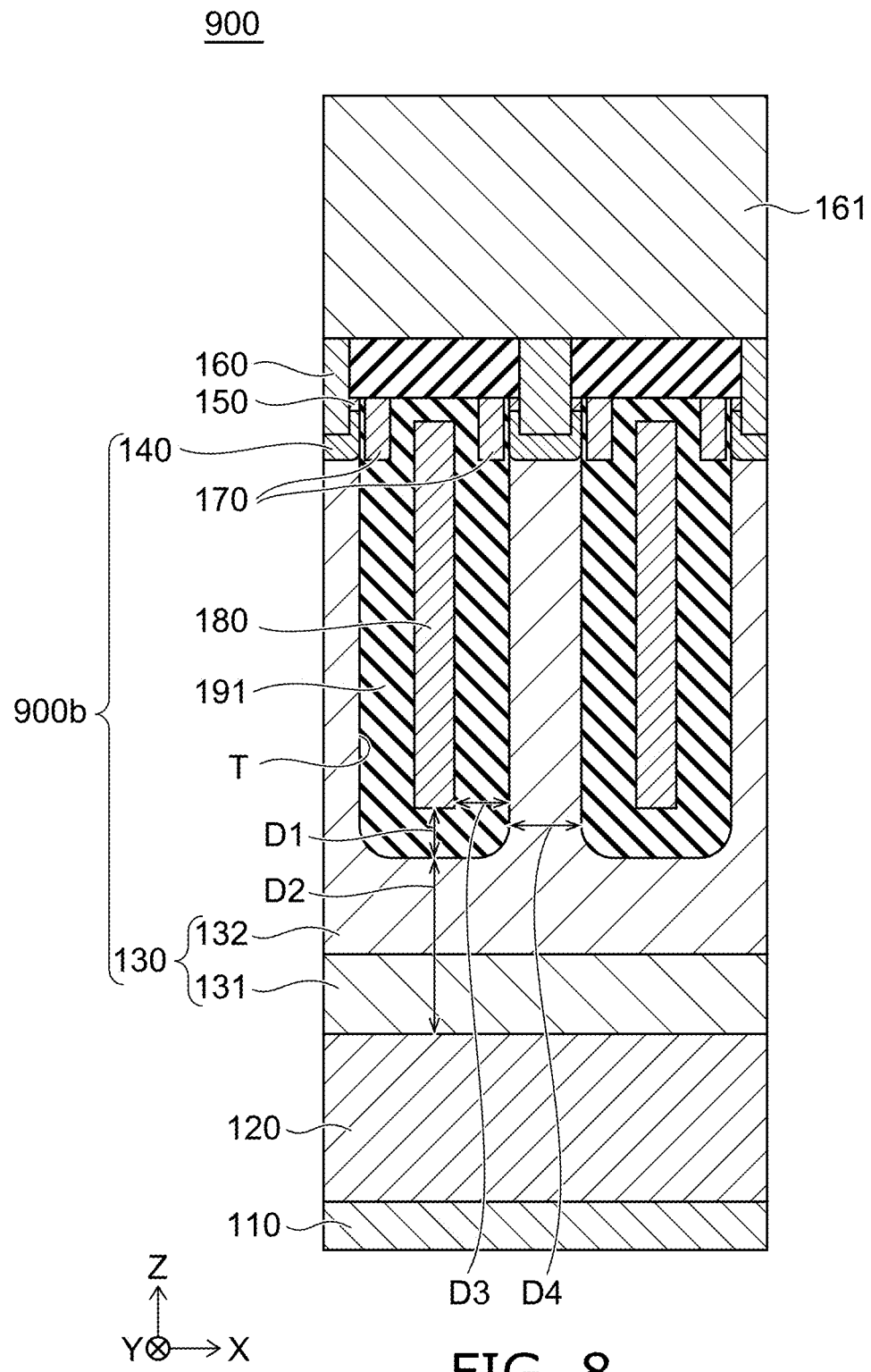
FIG. 8 is a cross-sectional view showing a semiconductor device according to a reference example.

FIG. 8 is a cross-sectional view showing a semiconductor device according to a reference example.

The reverse recovery characteristic of the semiconductor device 100 according to the embodiment will now be described while comparing to the reverse recovery characteristic of the semiconductor device 900 according to the reference example. The semiconductor device 900 according to the reference example differs from the semiconductor device 100 according to the embodiment in that the first distance D1 is less than the second distance D2, the third distance D3, and the fourth distance D4. Hereinbelow, the n-semiconductor layer 130 and the p-base diffusion layer 140 of the semiconductor device 900 according to the reference example are called a "body diode 900b".

Figure 9A:
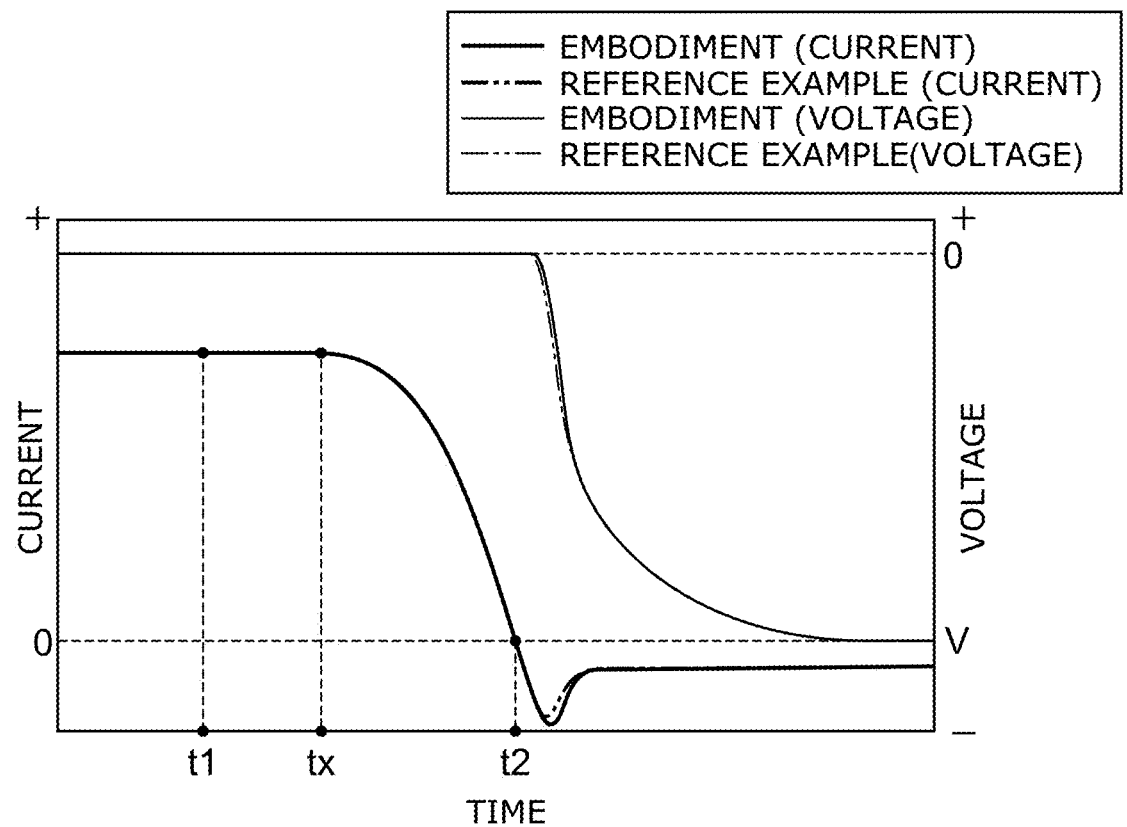
FIG. 9A is a graph showing a simulation of reverse recovery characteristics of the semiconductor device according to the first embodiment and the semiconductor device according to the reference example, in which the horizontal axis is time, the first vertical axis is the current, and the second vertical axis is the voltage.
Figure 9B:
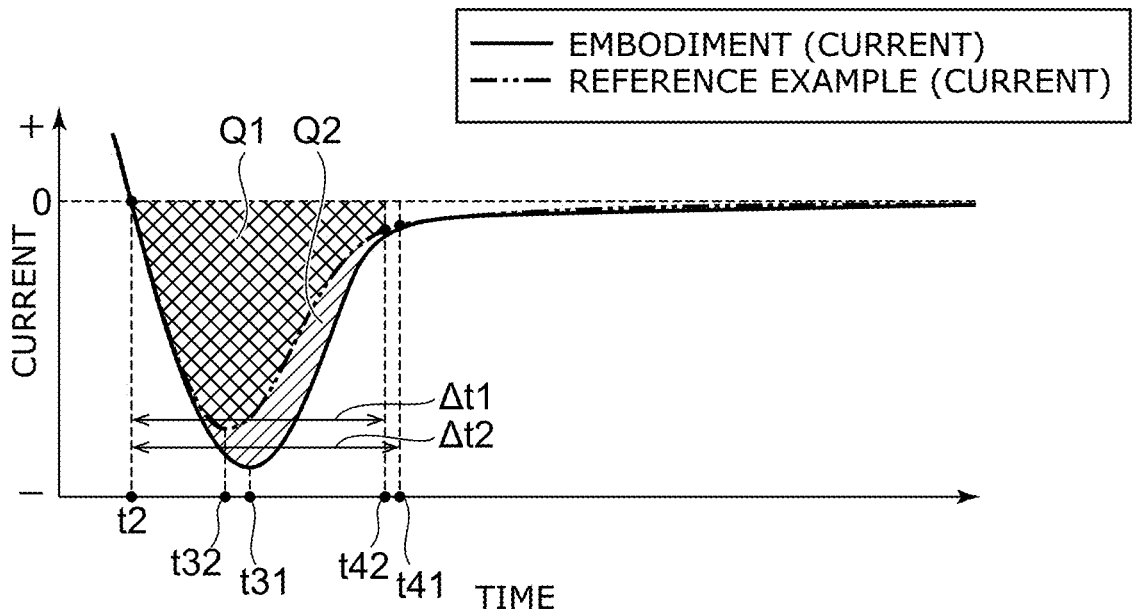
FIG. 9B is an enlarged graph showing a portion of FIG. 9A.

FIG. 9A is a graph showing a simulation of the reverse recovery characteristics of the semiconductor device according to the embodiment and the semiconductor device according to the reference example, in which the horizontal axis is time, the first vertical axis is the current, and the second vertical axis is the voltage; and FIG. 9B is an enlarged graph showing a portion of FIG. 9A.

In FIGS. 9A and 9B, the "current" means the current flowing between the drain electrode 110 and the source electrode 160, and the "voltage" means the voltage between the drain electrode 110 and the source electrode 160. In FIGS. 9A and 9B, the positive direction is taken as the direction of the current that is in the forward direction, i.e., the current flowing from the source electrode 160 toward the drain electrode 110. Also, in FIG. 9A, the positive direction is taken as the direction of the voltage when the potential of the drain electrode 110 is greater than the potential of the source electrode 160.

First, the body diodes 100b and 900b of the semiconductor devices 100 and 900 are biased in the forward direction. Thereby, currents are caused to flow in the forward direction through the body diodes 100b and 900b, and holes are injected from the p-base diffusion layer 140 into the n-semiconductor layer 130. Then, at a time tx, the body diodes 100b and 900b are biased in the reverse direction. Thereby, as shown in FIG. 9A, the currents that flow in the forward direction through the body diodes 100b and 900b gradually decrease, and currents start to flow in the reverse direction. Then, the currents that flow in the reverse direction gradually decrease, and ultimately, currents do not flow. In other words, the current values converge to zero. Also, the voltage between the drain electrode 110 and the source electrode 160 converges to a voltage V that is applied between the drain electrode 110 and the source electrode 160.

Hereinbelow, the time at which the currents flow in the forward direction in the body diodes 100b and 900b is taken as a "time t1". The time at which currents start to flow in the reverse direction is taken as a "time t2". The time at which the absolute value of the current flowing in the reverse direction in the body diode 900b of the reference example becomes a maximum is taken as a "time t31"; and the time at which the absolute value of the current flowing in the reverse direction in the body diode 100b of the embodiment becomes a maximum is taken as a "time t32". The time at which the absolute value of the current flowing in the reverse direction in the body diode 900b of the reference example becomes 10% of the absolute value of the current at the time t31 is taken as a "time t41"; and the time at which the absolute value of the current flowing in the reverse direction in the body diode 100b of the embodiment becomes 10% of the absolute value of the current at the time t32 is taken as a "time t42".

FIGS. 10A to 10D are maps showing simulation results of hole concentration distributions in the semiconductor device according to the reference example; and FIGS. 10E to 10H are maps showing simulation results of hole concentration distributions in the semiconductor device according to the embodiment.

FIG. 10A shows the hole concentration distribution in the semiconductor device 900 according to the reference example at the time t1. FIG. 10B shows the hole concentration distribution in the semiconductor device 900 according to the reference example at the time t2. FIG. 10C shows the hole concentration distribution in the semiconductor device 900 according to the reference example at the time t31. FIG. 10D shows the hole concentration distribution in the semiconductor device 900 according to the reference example at the time t41. FIG. 10E shows the hole concentration distribution in the semiconductor device 100 according to the embodiment at the time ti. FIG. 10F shows the hole concentration distribution in the semiconductor device 100 according to the embodiment at the time t2. FIG. 10G shows the hole concentration distribution in the semiconductor device 100 according to the embodiment at the time t32. FIG. 10H shows the hole concentration distribution in the semiconductor device 100 according to the embodiment at the time t42.

At the time t1 as shown in FIG. 10A, a current flows in the forward direction, and holes are injected from the p-base diffusion layer 140 to the n-semiconductor layer 130. Then, at the time tx, the body diode 900b is biased in the reverse direction. The current that flows in the forward direction through the body diode 900b is gradually reduced thereby, and a current starts to flow in the reverse direction.

At the times t2, t31, and t41, the current flows in the reverse direction through the body diode 900b. Therefore, as shown in FIGS. 10B to 10D, the hole concentration in the n-semiconductor layer 130 gradually decreases. In particular, the holes are easily reduced at the upper portion of the n-semiconductor layer 130 proximate to the source electrode 160 because the current flows upward. Therefore, as shown in FIG. 10D, the hole concentration at the upper portion of the n-semiconductor layer 130 becomes less than the hole concentration at the lower portion of the n-semiconductor layer 130, and particularly at the portion between the insulating film 191 and the n$^+$-drain layer 120. Thus, the holes are not easily reduced at the lower portion of the n-semiconductor layer 130.

Conversely, the first distance D1 of the semiconductor device 100 according to the embodiment is greater than the first distance D1 of the semiconductor device 900 according to the reference example. Therefore, the volume of the lower portion of the n-semiconductor layer 130 can be reduced.

As a result, as shown in FIGS. 10A and 10E, the amount of the holes generated in the n-semiconductor layer 130 of the semiconductor device 100 according to the embodiment at the time t1 is less than the amount of the holes generated in the n-semiconductor layer 130 of the semiconductor device 900 according to the reference example at the time t1.

Also, in the semiconductor device 100 according to the embodiment, the volume is reduced for the lower portion of the n-semiconductor layer 130, i.e., the portion of the n-semiconductor layer 130 where it is difficult to reduce the holes. Therefore, as shown in FIGS. 10B to 10D and FIGS. 10F to 10H, the decrease rate of the holes in the semiconductor device 100 according to the embodiment is faster than the decrease rate of the holes in the semiconductor device 900 according to the reference example.

As described above, the total amount of the holes generated in the semiconductor device 100 according to the embodiment is less than the total amount of the holes generated in the semiconductor device 900 according to the reference example. Therefore, as shown in FIG. 9B, the absolute value of the current flowing in the semiconductor device 100 according to the embodiment at the time t32 is less than the absolute value of the current flowing in the semiconductor device 100 according to the reference example at the time t31.

Also, a total amount Q1 of the current flowing in the semiconductor device 100 according to the embodiment from the time t2 to the time t42 is less than a total amount Q2 of the current flowing in the semiconductor device 900 according to the reference example from the time t2 to the time t41. The total amounts Q1 and Q2 of the currents also are called the "reverse recovery charges". Because the value of the reverse recovery charge multiplied by the voltage corresponds to the power loss, the switching loss of the body diode 100b can be reduced by reducing the reverse recovery charge.

Also, a time Δt2 from the time t2 to the time t42 in the semiconductor device 100 according to the embodiment can be less than a time Δt1 from the time t2 to the time t41 in the semiconductor device 900 according to the reference example. The times Δt1 and Δt2 also are called the "reverse recovery times". The switching time of the body diode 100b can be reduced by reducing the reverse recovery time.

Effects of the embodiment will now be described.

In the semiconductor device 100 according to the embodiment, the first distance D1 between the lower end of the field plate electrode 180 and the lower end of the insulating film 191 is greater than the second distance D2 between the insulating film 191 and the n$^+$-drain layer 120. The volume of the lower portion of the n-semiconductor layer 130 can be reduced thereby. Therefore, the total amount of the carriers generated in the n-semiconductor layer 130 when the n-semiconductor layer 130 is biased in the forward direction can be reduced. Therefore, the semiconductor device 100 can be provided in which the reverse recovery characteristic is improved.

The portion of the n-semiconductor layer 130 between the n$^+$-drain layer 120 and the trench T (or the lower end of the insulating film 191) is a portion through which the oncurrent does not easily flow when the semiconductor device 100 functions as a transistor. Therefore, even when the volume of this portion is reduced, there is little effect on the on-resistance when the semiconductor device 100 functions as a transistor. As a result, the reverse recovery characteristic can be improved while suppressing the increase of the on-resistance.

In such a semiconductor device 100, the field plate electrode 180 can be prevented from approaching the n⁺-drain layer 120 while reducing the volume of the lower portion of the n-semiconductor layer 130. Therefore, the concentration of the electric field in the portion of the n-semiconductor layer 130 between the trench T and the n⁺-drain layer 120 can be suppressed, and the decrease of the breakdown voltage of the semiconductor device 100 can be suppressed.

The trench T (or the lower end of the insulating film 191) reaches the n-buffer region 131. The volume of the lower portion of the n-semiconductor layer 130 can be reduced thereby. Therefore, the total amount of the carriers generated in the n-semiconductor layer 130 when the n-semiconductor layer 130 is biased in the forward direction can be reduced.

The first distance D1 is greater than the third distance D3 between the side surface of the field plate electrode 180 and the side surface of the insulating film 191. The volume of the lower portion of the n-semiconductor layer 130 can be reduced thereby. Therefore, the total amount of the carriers generated in the n-semiconductor layer 130 when the n-semiconductor layer 130 is biased in the forward direction can be reduced.

The first distance D1 is not less than 2 times the third distance D3. The volume of the lower portion of the n-semiconductor layer 130 can be reduced thereby. Therefore, the total amount of the carriers generated in the n-semiconductor layer 130 when the n-semiconductor layer 130 is biased in the forward direction can be reduced.

The first distance D1 is greater than the fourth distance D4 between the adjacent trenches T (or insulating films 191). Therefore, the total amount of the carriers generated in the n-semiconductor layer 130 when the n-semiconductor layer 130 is biased in the forward direction can be reduced.

In the semiconductor device 100 according to the embodiment, the lower end of the insulating film 191 is positioned lower than the second position P2. The volume of the lower portion of the n-semiconductor layer 130 can be reduced thereby. Therefore, the total amount of the carriers generated in the n-semiconductor layer 130 when the n-semiconductor layer 130 is biased in the forward direction can be reduced. Therefore, the semiconductor device 100 can be provided in which the reverse recovery characteristic is improved.

Second Embodiment

A second embodiment will now be described.

Figure 11:
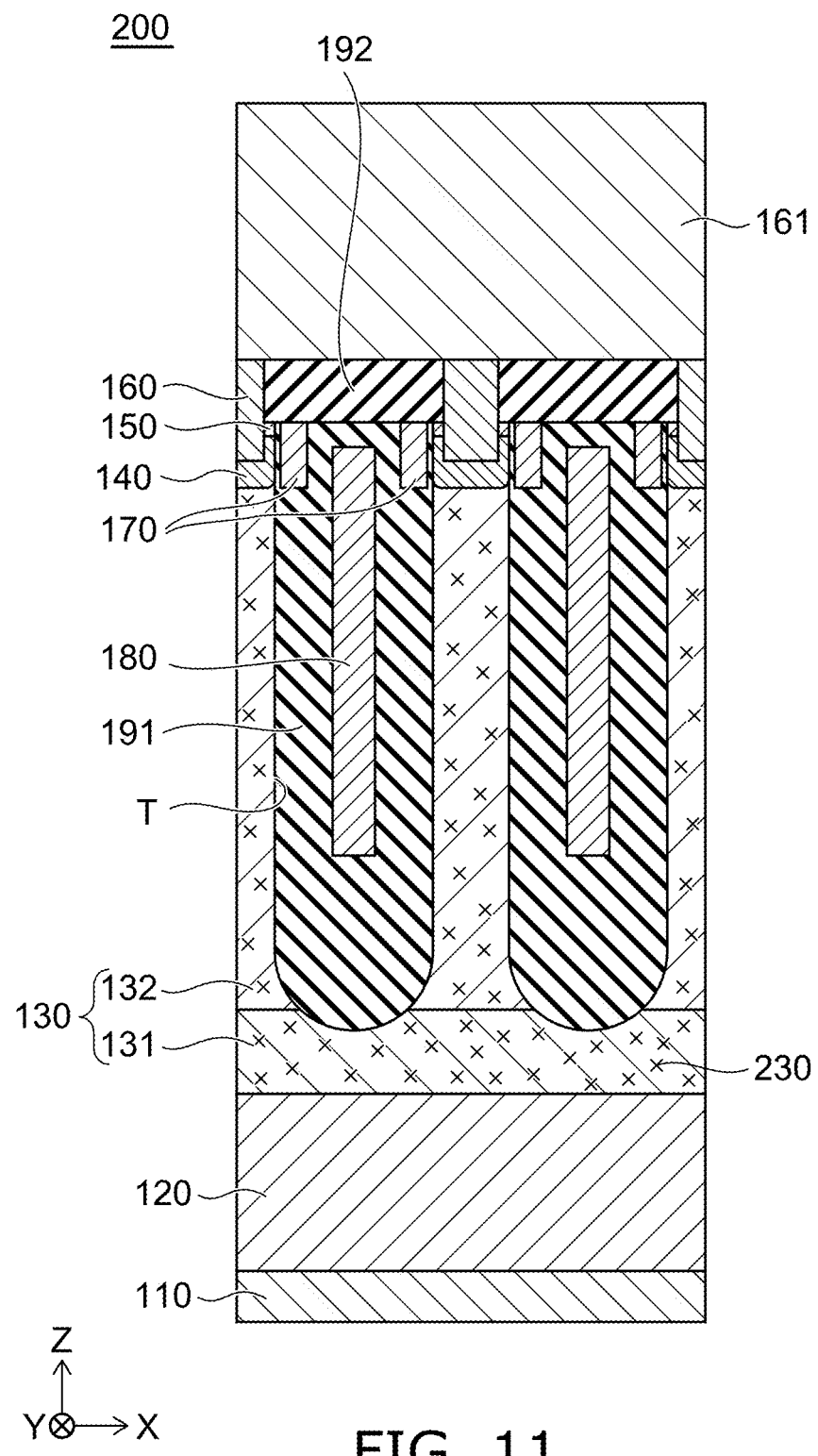
FIG. 11 is a cross-sectional view showing a semiconductor device according to a second embodiment.

FIG. 11 is a cross-sectional view showing a semiconductor device according to the embodiment.

As a general rule, only the differences with the first embodiment are described in the following description. Other than the items described below, the embodiment is similar to the first embodiment.

In the semiconductor device 200 according to the embodiment, recombination centers 230 are provided in the n-semiconductor layer 130. For example, the recombination centers 230 are made of crystal defects or impurity elements. For example, the crystal defects can be formed by injecting ions of H⁺, He⁺, etc., into the n-semiconductor layer 130. For example, the impurity element is an element such as tita- nium (Ti), platinum (Pt), gold (Au), or the like that functions as a recombination center. For example, the recombination centers 230 are provided in both the n-buffer region 131 and the n-drift region 132. However, for example, the recombination centers may be provided in the n-buffer region and may not be provided in the n-drain region.

Thus, in the semiconductor device 200 according to the embodiment, the crystal defects or the impurity elements are provided in the n-semiconductor layer 130. Therefore, the recombination of the holes and electrons generated in the n-semiconductor layer 130 is promoted. Therefore, the semiconductor device 200 can be provided in which the reverse recovery characteristic is improved.

Configurations are described in the embodiments described above in which the first conductivity type is the n-type, and the second conductivity type is the p-type. However, the first conductivity type may be the p-type, and the second conductivity type may be the n-type.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A semiconductor device, comprising:
    a first electrode;
    a first semiconductor layer connected to the first electrode, the first semiconductor layer being of a first conductivity type;
    a second semiconductor layer provided on the first semiconductor layer, the second semiconductor layer being of the first conductivity type, an impurity concentration of the second semiconductor layer being less than an impurity concentration of the first semiconductor layer, the second semiconductor layer including a region in which an impurity concentration gradually decreases along an upward direction from a lower end of the second semiconductor layer;
    a third semiconductor layer provided on the second semiconductor layer, the third semiconductor layer being of a second conductivity type;
    a fourth semiconductor layer provided on the third semiconductor layer, the fourth semiconductor layer being of the first conductivity type;
    a second electrode connected to the third and fourth semiconductor layers;
    a gate electrode extending in a first direction from the fourth semiconductor layer toward the second semiconductor layer, the gate electrode being next to the third semiconductor layer in a second direction crossing the first direction;
    a field plate electrode extending in the first direction, extending lower than the gate electrode, and being next to the second semiconductor layer in the second direction; and
    a first insulating film provided between the gate electrode and the third semiconductor layer, between the field plate electrode and the second semiconductor layer, and between the gate electrode and the field plate electrode, a first distance being greater than a second distance from the lower end of the first insulating film to the first semiconductor layer, the first distance being a thickness of the first insulating film from a lower end of the first insulating film to a center of a lower end of the field plate electrode in the second direction.

2. The device according to claim 1, wherein
the second semiconductor layer includes:
   a first region positioned on the first semiconductor layer, an impurity concentration of the first region being less than the impurity concentration of the first semiconductor layer; and
   a second region positioned on the first region, an impurity concentration of the second region being less than the impurity concentration of the first region, the first region being located between the first semiconductor layer and the second region, and
the first insulating film reaches the first region.

3. The device according to claim 1, wherein
the first distance is greater than a third distance between a side surface of the field plate electrode and a side surface of the first insulating film.

4. The device according to claim 3, wherein
the first distance is not less than 2 times the third distance.

5. The device according to claim 1, wherein
a crystal defect or an impurity element is provided in the second semiconductor layer.

6. The device according to claim 1, further comprising:
a second insulating film extending in the first direction,
the second insulating film being next to the first insulating film in the second direction, the fourth semiconductor layer, the third semiconductor layer, and a part of the second semiconductor layer being located between the first insulating film and the second insulating film,
the first distance being greater than a fourth distance between the first insulating film and the second insulating film.

7. The device according to claim 1, wherein an upper end of the field plate electrode is positioned upper than a lower end of the gate electrode.

8. The device according to claim 7,
wherein two of the gate electrodes are provided in the first insulating film,
wherein the upper end of the field plate electrode is positioned between the lower ends of the two of the gate electrodes.

9. A semiconductor device, comprising:
a first electrode;
a first semiconductor layer connected to the first electrode, the first semiconductor layer being of a first conductivity type;
a second semiconductor layer provided on the first semiconductor layer, the second semiconductor layer being of the first conductivity type, the second semiconductor layer including a region in which an impurity concentration gradually decreases along an upward direction from a lower end of the second semiconductor layer, an absolute value of a slope of a tangent of a curve of a profile of the impurity concentration in the vertical direction having a minimum at a first position in the region;
a third semiconductor layer provided on the second semiconductor layer, the third semiconductor layer being of a second conductivity type;
a fourth semiconductor layer provided on the third semiconductor layer, the fourth semiconductor layer being of the first conductivity type;
a second electrode connected to the third and fourth semiconductor layers;
a gate electrode extending from the fourth semiconductor layer toward the second semiconductor layer, the gate electrode being next to the third semiconductor layer;
a field plate electrode next to the second semiconductor layer; and
an insulating film provided between the gate electrode and the third semiconductor layer, between the field plate electrode and the second semiconductor layer, and between the gate electrode and the field plate electrode, a lower end of the insulating film being positioned lower than a second position in the region, the impurity concentration at the second position being one-half of the impurity concentration at the first position.

* * * * *